(12) United States Patent
Wang et al.

(10) Patent No.: US 9,236,854 B2
(45) Date of Patent: Jan. 12, 2016

(54) VOLTAGE SLOPE CONTROL METHOD AND APPARATUS FOR POWER DRIVER CIRCUIT APPLICATION

(71) Applicant: STMicroelectronics (Shenzhen) R&D Co. Ltd., Shenzhen (CN)

(72) Inventors: Meng Wang, Shenzhen (CN); Tao Tao Huang, Shenzhen (CN)

(73) Assignee: STMicroelectronics (Shenzhen) R&D Co. Ltd, Shenzhen (CN)

( * ) Notice: Subject to any disclaimer, the term of this patent is extended or adjusted under 35 U.S.C. 154(b) by 332 days.

(21) Appl. No.: 13/888,843

(22) Filed: May 7, 2013

(65) Prior Publication Data

US 2013/0313993 A1 Nov. 28, 2013

(30) Foreign Application Priority Data

May 24, 2012 (CN) .......................... 2012 1 0171018

(51) Int. Cl.
*H05B 37/02* (2006.01)
*H03K 5/12* (2006.01)

(52) U.S. Cl.
CPC ........................................ *H03K 5/12* (2013.01)

(58) Field of Classification Search
None
See application file for complete search history.

(56) References Cited

U.S. PATENT DOCUMENTS

| 8,093,878 B2* | 1/2012 | Goto et al. ..................... 323/285 |
| 8,988,056 B2* | 3/2015 | Smith et al. .................... 323/285 |
| 2005/0017767 A1 | 1/2005 | Huang et al. |
| 2006/0132194 A1 | 6/2006 | Harriman |
| 2008/0136467 A1* | 6/2008 | Tambouris et al. ........... 327/111 |
| 2013/0313993 A1 | 11/2013 | Wang et al. |

FOREIGN PATENT DOCUMENTS

CN          1526200 A        9/2004

* cited by examiner

*Primary Examiner* — Long Nguyen
(74) *Attorney, Agent, or Firm* — Gardere Wynne Sewell LLP (57) ABSTRACT

A drive circuit includes a first transistor coupled in series with a second transistor at a first intermediate node coupled to a load. An amplifier has an output driving a control terminal of the second transistor. The amplifier includes a first input coupled to a second intermediate node and a second input coupled to a reference voltage. A feedback circuit is coupled between the first intermediate node and the second intermediate node. A slope control circuit is coupled the second intermediate node. The slope control circuit injects a selected value of current into the second intermediate node, that current operating to control the output of the amplifier in setting a slope for change in voltage at the first intermediate node.

23 Claims, 5 Drawing Sheets

VOLTAGE SLOPE CONTROL METHOD AND APPARATUS FOR POWER DRIVER CIRCUIT APPLICATION

PRIORITY CLAIM

This application claims priority from Chinese Application for Patent No. 201210171018.9 filed May 24, 2012, the disclosure of which is hereby incorporated by reference.

BACKGROUND

1. Technical Field

The present invention relates generally to power driver circuits and their operation and in particular to a method and apparatus for controlling output voltage slope of a power driver.

2. Introduction

Figure 1:
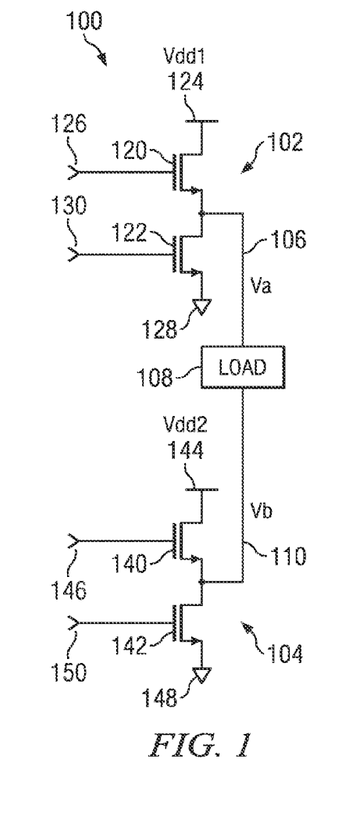
FIG. 1 is a circuit diagram of a power driver circuit.

Reference is made to FIG. 1 which shows a circuit diagram of a power driver circuit 100. The circuit 100 includes a high side driver 102 and a low side driver 104. The output of the high side driver 102 is coupled to a high side node 106 of a load 108. The output of the low side driver 104 is coupled to a low side node 110 of the load 108. In the exemplary implementation of FIG. 1, the load 108 is a display panel of an AMOLED type and the high side node 106 and low side node 110 are the voltage supply nodes (Va and Vb) for the display panel. It will be understood, however, that the load 108 may comprise any suitable load driven from both the high and low side.

The high side driver 102 comprises a pair of series connected transistors 120 and 122. The transistors 120 and 122 are of the n-channel MOSFET type coupled in series through their source-drain paths. It will be understood that transistors of other type may instead be used, the reference to n-channel MOSFET devices being exemplary only of a preferred implementation. P-channel MOSFETs, combinations of n-channel and p-channel MOSFETs, bi-polar devices and/or IGFET type devices may alternatively be used.

The transistor 120 includes a conduction (drain) terminal coupled to a first power supply node 124 and a conduction (source) terminal coupled to the high side node 106. A control (gate) terminal of the transistor 120 is coupled to a first control node 126. The transistor 122 includes a conduction (drain) terminal coupled to the high side node 106 and a conduction (source) terminal coupled to a second power supply node 128. A control (gate) terminal of the transistor 122 is coupled to a second control node 130.

The low side driver 104 comprises a pair of series connected transistors 140 and 142. The transistors 140 and 142 are of the n-channel MOSFET type coupled in series through their source-drain paths. It will be understood that transistors of other type may instead be used, the reference to n-channel MOSFET devices being exemplary only of a preferred implementation. P-channel MOSFETs, combinations of n-channel and p-channel MOSFETs, bi-polar devices and/or IGFET type devices may alternatively be used.

The transistor 140 includes a conduction (drain) terminal coupled to a third power supply node 144 and a conduction (source) terminal coupled to the low side node 110. A control (gate) terminal of the transistor 140 is coupled to a third control node 146. The transistor 142 includes a conduction (drain) terminal coupled to the low side node 110 and a conduction (source) terminal coupled to a fourth power supply node 148. A control (gate) terminal of the transistor 142 is coupled to a fourth control node 150.

The first and third power supply nodes 124 and 144 are preferably coupled to receive high supply voltages (for example, Vdd1 and Vdd2). These may, for example, be different high supply voltages, or the same high supply voltage, depending on circuit application.

The second and fourth supply nodes 128 and 148 are preferably coupled to receive low supply voltages. These may, for example, be different low supply voltages, or the same low supply voltage (for example, ground), depending on circuit application.

Figure 2:
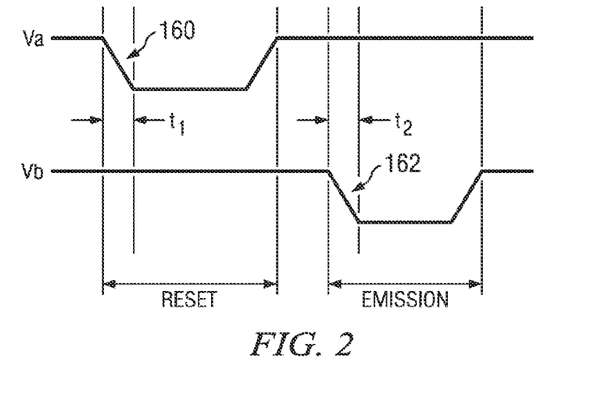
FIG. 2 illustrates voltage waveforms for the voltage signals at the high side node and low side node of the circuit in FIG. 1.

Reference is now made to FIG. 2 which illustrates voltage waveforms for the voltage signals at the high side node 106 (voltage signal Va) and low side node 110 (voltage signal Vb). These waveforms are specific to the exemplary implementation of FIG. 1 where the load 108 is a display panel of an AMOLED type. It will be understood, however, that high and low side waveforms having a similar shape and timing may be applicable with other types of loads.

During a period of time associated with resetting the display panel load 108 (of an AMOLED type), the high side driver 102 and low side driver 104 are controlled by application of appropriate control signaling to the first, second, third and fourth control nodes 126, 130, 146 and 150 of the transistors 120, 122, 140 and 142, respectively, to pull down the voltage at the high side node 106 (voltage signal Va) as indicated at reference 160. The reset time period terminates when the voltage at the high side node 106 (voltage signal Va) returns high. During a first time period t1 associated with initially pulling down the voltage at the high side node 106, it is important to exercise control over the downward voltage slope. In particular, there is a need to control the slope in a manner which ensures that no voltage/current spike is introduced during the power driving operation.

During a period of time associated with emission in the display panel load 108 (of an AMOLED type), the high side driver 102 and low side driver 104 are controlled by application of appropriate control signaling to the first, second, third and fourth control nodes 126, 130, 146 and 150 of the transistors 120, 122, 140 and 142, respectively, to pull down the voltage at the low side node 110 (voltage signal Vb) as indicated at reference 162. The emission time period terminates when the voltage at the low side node 110 (voltage signal Vb) returns high. During a second time period t2 associated with initially pulling down the voltage at the low side node 110, it is important to exercise control over the downward voltage slope. In particular, there is a need to control the slope in a manner which ensures that no voltage/current spike is introduced during the power driving operation.

SUMMARY

In an embodiment, a circuit comprises: a drive circuit including a first transistor coupled in series with a second transistor at a first intermediate node configured to be coupled to a load; a capacitance coupled between the first intermediate node and a second intermediate node; an amplifier having a first input coupled to the second intermediate node, a second input coupled to a reference voltage and an output coupled to a control terminal of the second transistor; and a current source configured to source a current having a selectable value to said second intermediate node.

In an embodiment, a circuit comprises: a drive circuit including a first transistor coupled in series with a second transistor at a first intermediate node configured to be coupled to a load; an amplifier having a first input coupled to a second intermediate node, a second input coupled to a reference voltage and an output coupled to a control terminal of the second transistor; a feedback circuit coupled between the first intermediate node and the second intermediate node; and a slope control circuit coupled the second intermediate node and configured to control the output of the amplifier in setting a slope for change in voltage at the first intermediate node.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF THE DRAWINGS

Embodiments are illustrated by way of example in the accompanying figures not drawn to scale, in which like reference numbers indicate similar parts, and in which.

DETAILED DESCRIPTION OF THE DRAWINGS

Figure 3:
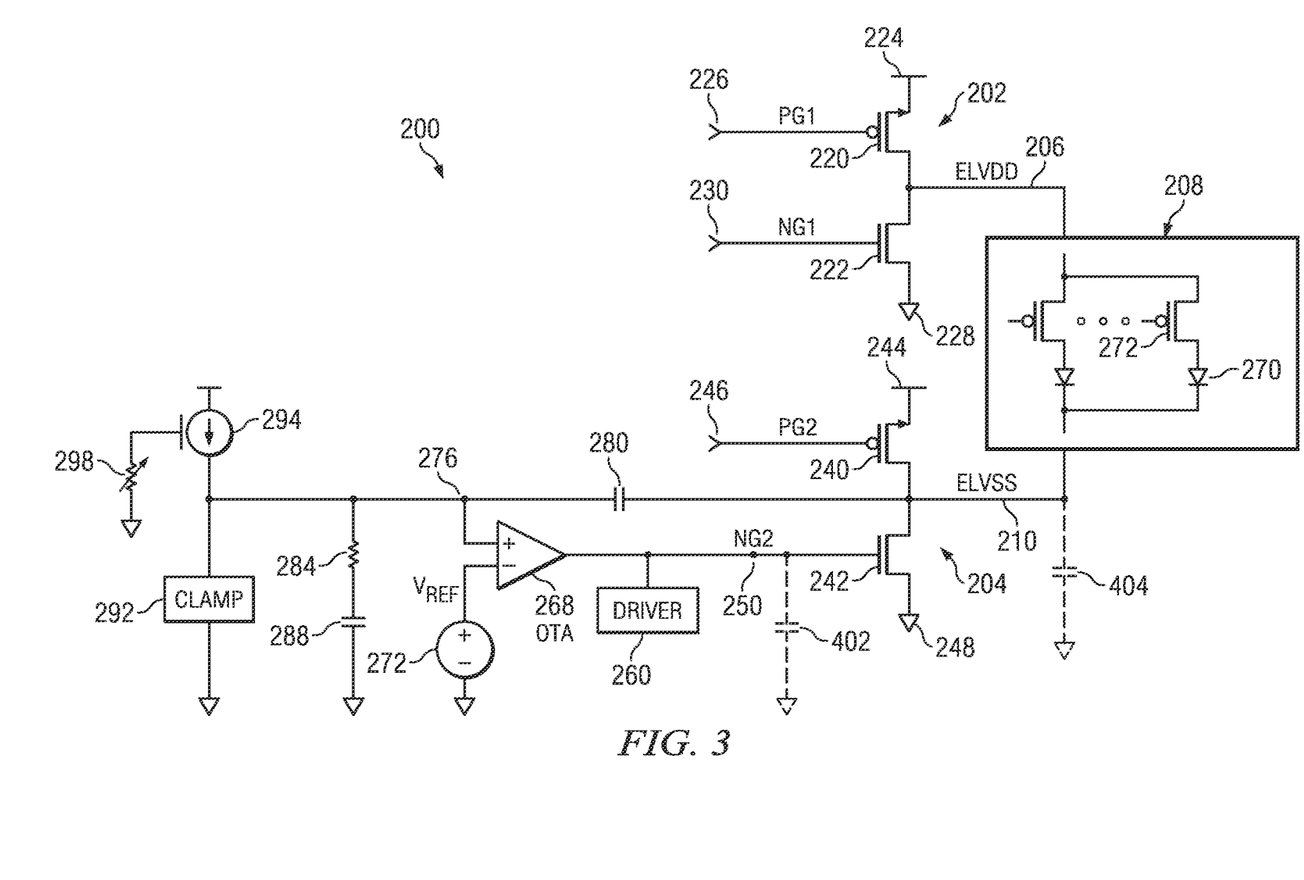
FIG. 3 is a diagram of an embodiment of a control circuit.

Reference is now made to FIG. 3 showing a diagram of an embodiment of a control circuit 200. The circuit 200 includes a high side driver 202 and a low side driver 204. The output of the high side driver 202 is coupled to a high side node (ELVDD) 206 of a load 208. The output of the low side driver 204 is coupled to a low side node 210 (ELVSS) of the load 208. In the exemplary implementation of FIG. 3, the load 208 is a display panel of an AMOLED type which includes a plurality of diodes 270, each diode coupled in series with a control transistor 272 between the high side node (ELVDD) 206 and the low side node 210 (ELVSS). It will be understood, however, that the load 208 may comprise any suitable load driven from both the high and low side.

The high side driver 202 comprises a pair of series connected transistors 220 and 222. The transistor 220 is of the p-channel MOSFET type and the transistor 222 is of the re-channel MOSFET type. These transistors are coupled in series through their source-drain paths. It will be understood that transistors of other type may instead be used, the reference to p-channel and n-channel MOSFET devices being exemplary only of a preferred implementation. P-channel MOSFETs, n-channel MOSFETs, bi-polar devices and/or IGFET type devices may alternatively be used.

The transistor 220 includes a conduction (source) terminal coupled to a first power supply node 224 and a conduction (drain) terminal coupled to the high side node 206. A control (gate) terminal of the transistor 220 is coupled to a first control node 226 (PG1). The transistor 222 includes a conduction (drain) terminal coupled to the high side node 206 and a conduction (source) terminal coupled to a second power supply node 228. A control (gate) terminal of the transistor 222 is coupled to a second control node 230 (NG1).

The low side driver 204 comprises a pair of series connected transistors 240 and 242. The transistor 240 is of the p-channel MOSFET type and the transistor 242 is of the re-channel MOSFET type. These transistors are coupled in series through their source-drain paths. It will be understood that transistors of other type may instead be used, the reference to p-channel and n-channel MOSFET devices being exemplary only of a preferred implementation. P-channel MOSFETs, n-channel MOSFETs, bi-polar devices and/or IGFET type devices may alternatively be used.

The transistor 240 includes a conduction (source) terminal coupled to a third power supply node 244 and a conduction (drain) terminal coupled to the low side node 210. A control (gate) terminal of the transistor 240 is coupled to a third control node 246 (PG2). The transistor 242 includes a conduction (drain) terminal coupled to the low side node 210 and a conduction (source) terminal coupled to a fourth power supply node 248. A control (gate) terminal of the transistor 242 is coupled to a fourth control node 250 (NG2).

The first and third power supply nodes 224 and 244 are preferably coupled to receive high supply voltages. These may, for example, be different high supply voltages, or the same high supply voltage, depending on circuit application.

The second and fourth supply nodes 228 and 248 are preferably coupled to receive low supply voltages. These may, for example, be different low supply voltages, or the same low supply voltage (for example, ground), depending on circuit application.

Figure 7:
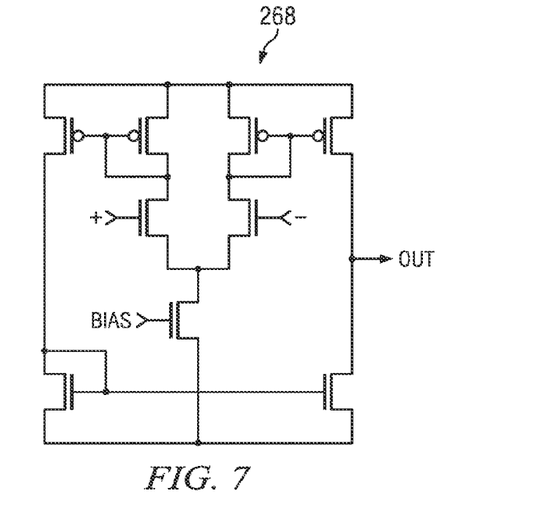
FIG. 7 is a circuit diagram for an OTA circuit within the control circuit of FIG. 3.

The circuit 200 further comprises an operational transconductance amplifier (OTA) circuit 268 (see, exemplary circuit diagram in FIG. 7). An output of the OTA circuit 268 is coupled to the fourth control node 250 (NG2) of the transistor 242. A negative input terminal of the OTA circuit 268 is coupled to a voltage source 272 supplying a reference voltage Vref. A positive input terminal of the OTA circuit 268 is coupled to a first intermediate node 276. A feedback capacitor 280 is coupled between the first intermediate node 276 and the low side node 210.

The circuit 200 further comprises a driver circuit 260 coupled at the output of the OTA circuit 268 to assist in driving the fourth control node 250 (NG2) of the transistor 242. The driver circuit 260 is necessary because the OTA circuit 268 has limited output driver capability and limited output voltage range. The driver circuit 260 functions to pull-up the fourth control node 250 to Vdd when the OTA circuit 268 must drive its output higher than Vdd-Vth. The driver circuit further functions to pull-down the output to ground when the OTA circuit 268 must drive its output lower than Vth. The operation of the driver circuit 260 is controlled to implement a dead-time functionality.

Figure 4:
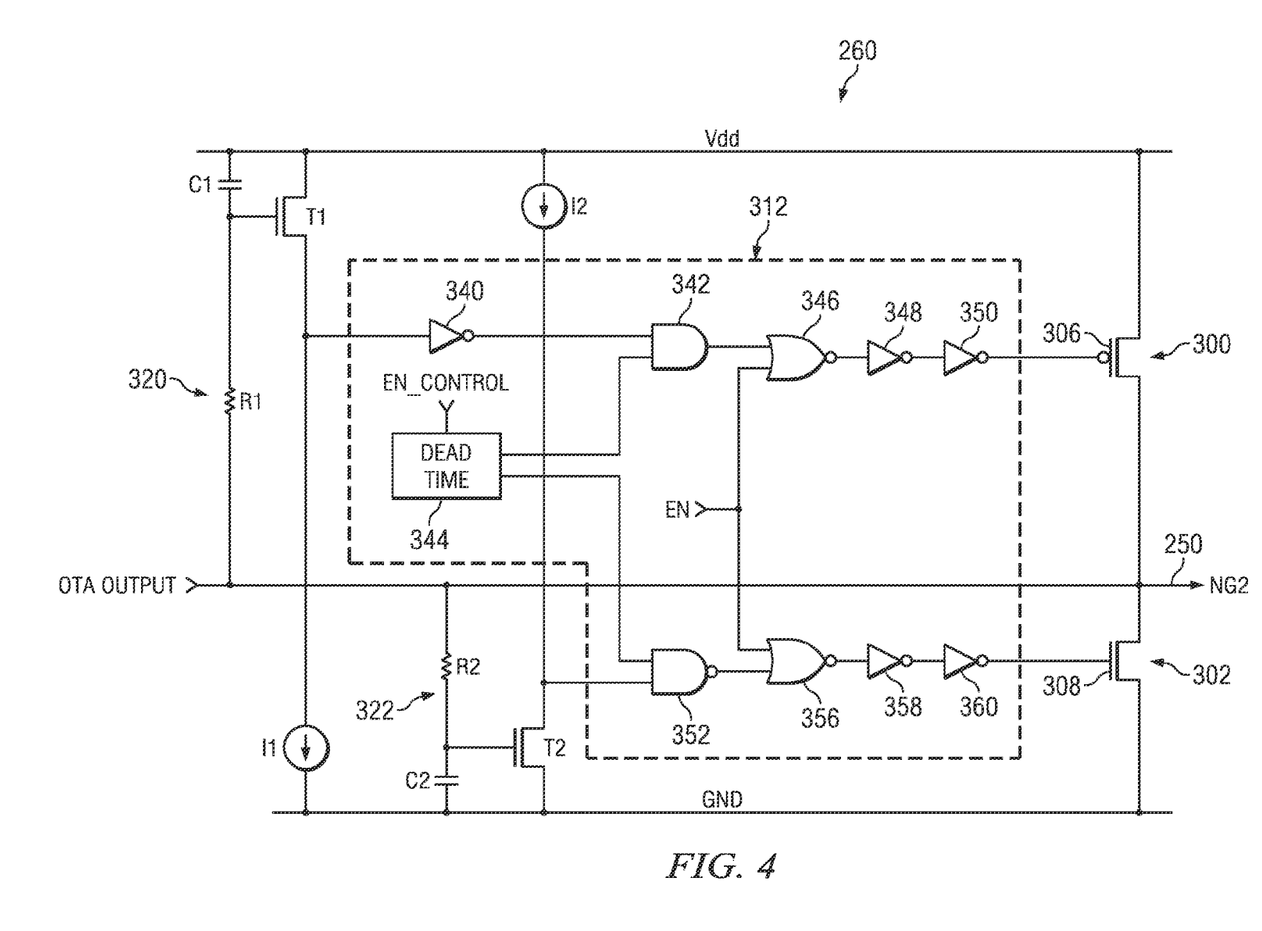
FIG. 4 is a circuit diagram of a driver circuit within the control circuit of FIG. 3.

Reference is now made to FIG. 4 which illustrates a circuit diagram of the driver circuit 260. The driver circuit 260 is coupled to the fourth control node 250 at the output of the OTA circuit 268. The driver circuit includes pull-up circuitry 300 coupled between a reference voltage node (in this case comprising the Vdd node) and the fourth control node 250, and pull-down circuitry 302 coupled between the fourth control node 250 and a reference voltage node (in this case comprising the ground node). The pull-up circuitry 300 comprises a power MOSFET transistor 306 of the p-channel type whose conduction (source) node is coupled to the Vdd node and whose conduction (drain) node is coupled to the fourth control node 250. The pull-down circuitry 302 comprises a power MOSFET transistor 308 of the n-channel type whose conduction (source) node is coupled to the ground node and whose (conduction) drain node is coupled to the fourth control node 250. The control (gate) terminals of the transistors 306 and 308 are driven by logic circuitry 312 configured to ensure that only one of the transistors 306 and 308 is turned on at any given time. The logic circuitry 312 receives a first enable signal EN which enables the setting of a fixed output status of the driver circuit 260 (for example, by setting the on/off state of the transistors 306 and 308 during system power on/off or when a system error is detected), and further receives a second enable signal EN_Control which enables operation to control output operation with voltage slope control (for example to control slope of the waveforms shown in FIG. 2).

Although MOSFET devices are illustrated in FIG. 4, it will be understood that other types of transistors could be used for pull-up and pull-down functionality.

The driver circuit 260 further includes a first voltage sense circuit 320 and a second voltage sense circuit 322.

The first voltage sense circuit 320 functions to sense voltage at the output of the OTA circuit 268 higher than a first threshold. Responsive to such detection, the first voltage sense circuit 320 generates a first output signal applied to a first control input of the logic circuitry 312 and passed therethrough to control turning on of the power MOSFET transistor 306 at the gate terminal. Thus, the pull-up circuitry 300 is actuated in response to detection by the first voltage sense circuit 320 of a voltage at the output of the OTA circuit 268 higher than the first threshold. The power MOSFET transistor 306 in the actuated pull-up circuitry 300 forms a low resistance path between the fourth control node 250 at the output of the OTA circuit 268 and the Vdd reference supply node.

The first voltage sense circuit 320 comprises a resistor R1 and capacitor C1 coupled in series between the output of the OTA circuit 268 and a reference voltage node (in this case comprising the Vdd node). A MOSFET transistor T1 of the p-channel type has a control (gate) terminal coupled to series connection node between the resistor R1 and capacitor C1. A conduction (source) terminal of the transistor T1 is coupled to the Vdd node, and a conduction (drain) terminal is coupled to the output of the first voltage sense circuit 320. A current source I1 is coupled between the output of the first voltage sense circuit 320 and a reference voltage supply node (in this case comprising the ground node). The output of the first voltage sense circuit 320 generates the first output signal applied to the first control input of the logic circuitry 312.

The second voltage sense circuit 322 functions to sense voltage at the output of the OTA circuit 268 lower than a second threshold. Responsive to such detection, the second voltage sense circuit 322 generates a second output signal applied to a second control input of the logic circuitry 312 and passed therethrough to control turning on of the power MOSFET transistor 308 at the gate terminal. Thus, the pull-down circuitry 302 is actuated in response to detection by the second voltage sense circuit 322 of a voltage at the output of the OTA circuit 268 lower than the second threshold. The power MOSFET transistor 308 in the actuated pull-down circuitry 302 forms a low resistance path between the fourth control node 250 at the output of the OTA circuit 268 and the ground reference supply node.

The second voltage sense circuit 322 comprises a resistor R2 and capacitor C2 coupled in series between the output of the OTA circuit 268 and a reference voltage node (in this case comprising the ground node). A MOSFET transistor T2 of the n-channel type has a control (gate) terminal coupled to series connection node between the resistor R2 and capacitor C2. A conduction (source) terminal of the transistor T2 is coupled to the ground node, and a conduction (drain) terminal is coupled to the output of the first voltage sense circuit 320. A current source I2 is coupled between the output of the second voltage sense circuit 322 and a reference voltage supply node (in this case comprising the Vdd node). The output of the second voltage sense circuit 322 generates the second output signal applied to the second control input of the logic circuitry 312.

The logic circuitry 312 comprises a first inverter 340 having an input coupled to the output of the first voltage sense circuit 320. An AND gate 342 has a first input coupled to the output of the first inverter 340 and a second input coupled to a first output of a dead time control circuit 344. A first NOR gate 346 has a first input coupled to the output of the AND gate 342 and a second input coupled to receive the first enable signal EN. A pair of buffering inverters 348 and 350 are coupled between the output of the first NOR gate 346 and the gate terminal of the power MOSFET transistor 306 for the pull-up circuitry 300. A NAND gate 352 has a first input coupled to the output of the second voltage sense circuit 322 and a second input coupled to a second output of the dead time control circuit 344. A second NOR gate 356 has a first input coupled to the output of the NAND gate 352 and a second input coupled to receive the first enable signal EN. A pair of buffering inverters 358 and 360 are coupled between the output of the second NOR gate 356 and the gate terminal of the power MOSFET transistor 308 for the pull-down circuitry 302. The dead time control circuit 344 includes an input receiving the second enable signal EN_Control which enables the circuitry to operate in slope control mode. The dead time control circuit 344 functions to ensure that transistors 306 and 308 are not on at the same time. Logic circuitry for implementing this functionality is well known in the art. The circuit generates output signals having a non-overlapping characteristic with a pre-determined dead time between the active state of the first signal (applied to gate 342 for transistor 306) and the active state of the second signal (applied to gate 352 for transistor 308).

Reference is now once again made to FIG. 3. The circuit 200 further comprises a resistor 284 and capacitor 288 coupled in series between the first intermediate node 276 and a reference voltage supply node (in this case comprising the second and fourth supply nodes 228 and 248 receiving the low supply voltage (ground)). A clamp circuit 292 is also coupled between the first intermediate node 276 and the reference voltage supply node (224/228). A variable current source 294 is coupled to source fixed current into the first intermediate node 276. The variable current source has a control terminal input. The value of the fixed current output by the current source 294 is set by the value of a variable resistance connected to the control terminal input. The variable resistance may be provided by a variable control resistor 298 or alternatively a transistor. The value of resistance can be adjusted according to application requirement. Varying the resistance value at the control input (for example using the variable control resistor 298) changes the value of the current output from current source 294 and this directly affects voltage slope for driving the fourth control node 250 (NG2) of the transistor 242. In slope control phase, the variable current output from the current source 294 (Iadj) is equal to the current at intermediate node 276 (I276), and the voltage at the intermediate node 276 (V276) is equal to the voltage output from voltage source 272 (Vref). The change in voltage at the low side node 210 (ELVSS) of the load 208 ($\Delta$V210) is set by the following equation:

$$\Delta V210 = (Iadj \times \Delta t)/C280,$$

wherein Δt is the change in time, and C280 is the capacitance of feedback capacitor 280. Thus, with changes in the value of the current output from the current source 294 there is a corresponding change in the slope (rate of change in voltage over time) at the low side node 210 (ELVSS) of the load 208. With reference to FIG. 2, this means that the slope of the Va and Vb waveforms can be controlled at references 160 and 162.

Figure 5:
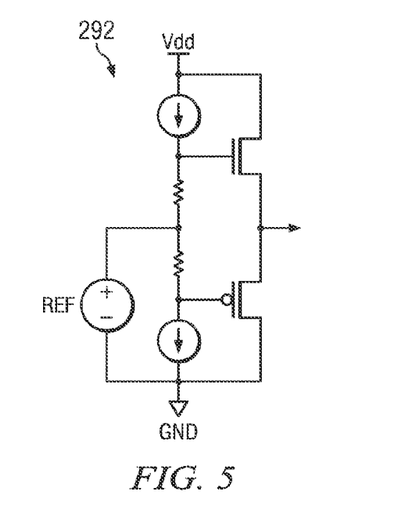
FIG. 5 is a circuit diagram for a clamp circuit within the control circuit of FIG. 3.

The clamp circuit functions to clamp the voltage at the first intermediate node 276 to within a certain range of a reference voltage. As an example, the voltage is clamped to a reference voltage of 2V plus/minus a range voltage of 0.2V. FIG. 5 illustrates a circuit diagram for an example of a clamp circuit 292. The benefit of the clamp circuit 292 is to speed up circuit 200 operation when the driver circuit 260 is enabled. This operation is necessary because the charge current from current source 294 is small and thus it takes a significant amount of time for the feedback loop through capacitor 380 to set up the operating voltage point for the first intermediate node 276 during long time slope control. A significant improvement in circuit 200 performance is experienced with the contribution of the clamp circuit 292 to set the operating voltage point for the first intermediate node 276.

Although not specifically illustrated, the first and second enable signals can further be applied to control operation of the OTA circuit 268 in order to control static power consumption with the circuit 200.

Those skilled in the art will recognize that the circuit of FIG. 3 includes two uncertain parasitic capacitances. A first parasitic capacitance is schematically represented by capacitor 402 as the gate capacitance of the transistor 242. A second parasitic capacitance is schematically represented by capacitor 404 as the equivalent capacitance of the load 208 (in the illustrated example this being the panel equivalent capacitance for the display panel of an AMOLED type). The resistor 284 and capacitor 288 coupled in series between the first intermediate node 276 and a reference voltage node 228/248 define a filter circuit in the feedback loop which introduces a dominant pole to compensate for a parasitic pole introduced by one or both of the parasitic capacitances (402 and 404).

Figure 6A:
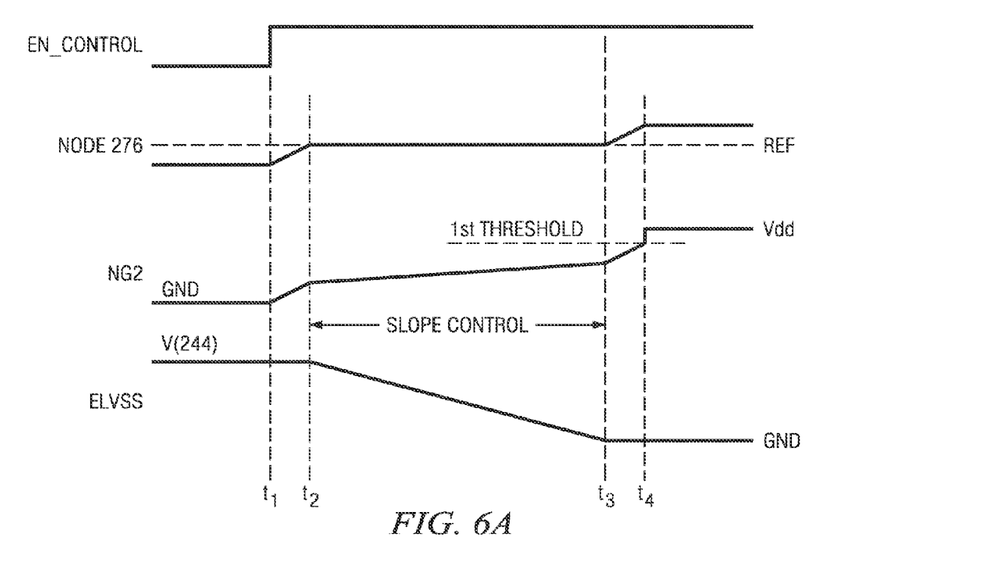
FIGS. 6A and 6B are timing diagrams illustrating operation of the circuitry shown in FIGS. 3-4 during pull-up and pull-down, respectively.

Reference is now made to FIG. 6A which illustrates a timing diagram for operation of the circuitry shown in FIGS. 3-4 during pull-up. When the second enable signal EN_Control is inactive (logic low), and the fourth control node 250 (NG2) of the transistor 242 is low (i.e., at ground), the transistor 240 is on, the transistor 242 is off, and the voltage at ELVSS node 210 is equal to the voltage at supply node 244. The clamp circuitry 292 sets the voltage at the first intermediate node 276 to the reference voltage minus the range voltage. At time t1, the second enable signal EN_Control transitions to active (logic high) enabling slope control mode of operation. The voltage at first intermediate node 276 rises to the reference voltage and the voltage at the fourth control node 250 (NG2) of the transistor 242 also begins to rise under the influence of the OTA circuit 268. At time t2, the OTA circuit output voltage at the fourth control node 250 (NG2) of the transistor 242 has risen sufficiently to overcome the threshold voltage of transistor 242 and the slope control period begins. Transistor 242 begins to conduct and the OTA circuit 268 controls an increase in the voltage at the fourth control node 250 (NG2) of the transistor 242 producing a corresponding change in the voltage at node 210 (ELVSS), where the rate of change (slope) is controlled by the amount of current supplied to first intermediate node 276 by the current source 294 (the amount of current being set by the value of variable resistor 298). At time t3, the voltage at the ELVSS node 210 reaches ground and the slope control period ends. The clamp circuitry 292 sets the voltage at first intermediate node 276 to the reference voltage plus the range voltage, and the voltage at the fourth control node 250 (NG2) of the transistor 242 continues to rise. At time t4, the voltage at the fourth control node 250 (NG2) of the transistor 242 exceeds the first threshold (as sensed by the first voltage sense circuit 320) and the pull-up circuitry 300 is activated to form a low resistance path through actuated transistor 306 from the fourth control node 250 to Vdd.

Figure 8:
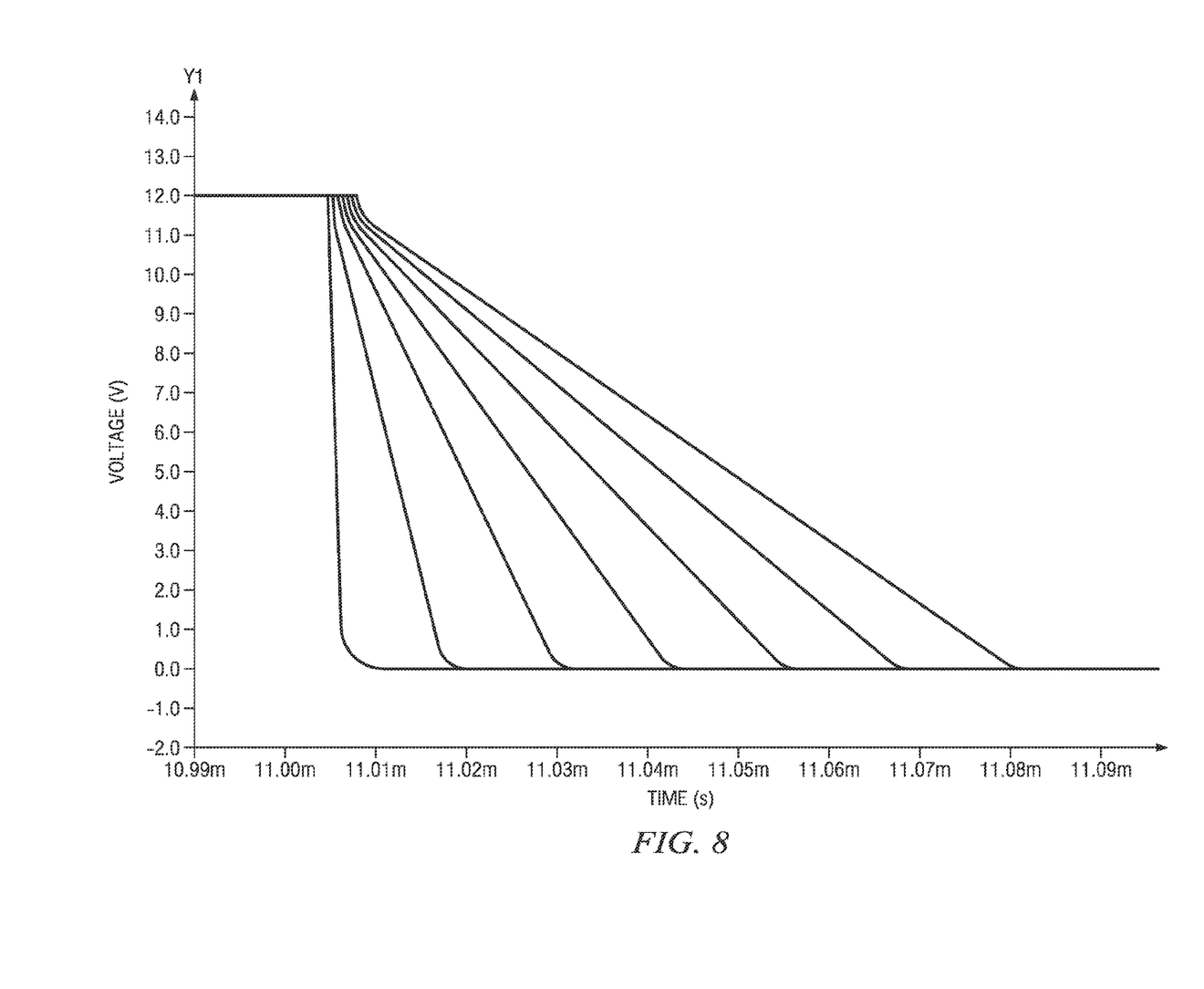
FIG. 8 illustrates different slopes for the controlled voltage during slope control mode for different values of variable current.

FIG. 8 illustrates different slopes for the voltage at the ELVSS node 210 during slope control mode for different values of the variable current output from the current source 294 (Iadj).

Figure 6B:
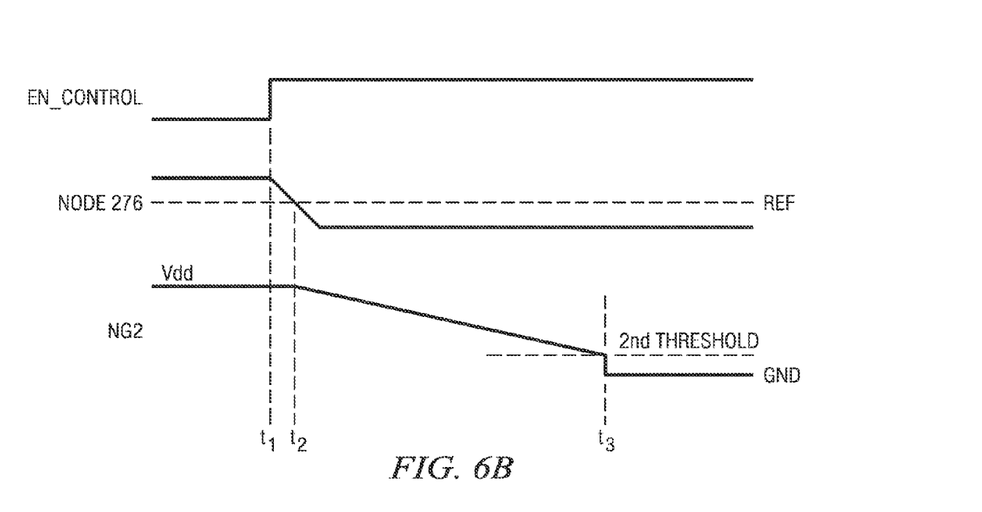

Reference is now made to FIG. 6B which illustrates a timing diagram for operation of the circuitry shown in FIGS. 3-4 during pull-down. The clamp circuitry 292 sets the voltage at the first intermediate node 276 to the reference voltage plus the range voltage. At time t1, the second enable signal EN_Control transitions to active (logic high) enabling operation. The voltage at the first intermediate node 276 falls to and past the reference voltage. At time t2, the OTA circuit output voltage at the fourth control node 250 (NG2) of the transistor 242 begins to fall and transistor 242 begins to turn off. At time t3, the voltage at the fourth control node 250 (NG2) of the transistor 242 has fallen to less than the second threshold (as sensed by the second voltage sense circuit 322) and the pull-down circuitry 302 is activated to form a low resistance path through actuated transistor 308 from the fourth control node 250 to ground.

Although illustrated with respect to controlling the operation of transistor 242, it will be understood that the circuitry of FIGS. 3-5 may also be used in connection with controlling the operation of transistor 222.

The foregoing description has been provided by way of exemplary and non-limiting examples of a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
   a drive circuit including a first transistor coupled in series with a second transistor at a first intermediate node configured to be coupled to a load;
   a capacitor coupled between the first intermediate node and a second intermediate node;
   an amplifier having a first input coupled to the second intermediate node, a second input coupled to a reference voltage and an output coupled to a control terminal of the second transistor; and
   a current source configured to source a current to said second intermediate node having a value responsive to a control signal that is independent of an output signal at the first intermediate node.

2. The circuit of claim 1, further comprising a clamp circuit configured to clamp a voltage at the second intermediate node to a value substantially equal to a clamp reference voltage.

3. The circuit of claim 1, further comprising a variable resistor coupled to said current source and configured to generate said control signal, where the value of said current sourced by said current source is responsive to a resistance value of said variable resistor.

4. The circuit of claim 1, further comprising a pull-up circuit coupled to said control terminal of the second transistor, said pull-up circuit configured to sense a voltage on said control terminal of the second transistor and pull-up said control terminal voltage to a high supply voltage if the sensed voltage rises to a first threshold voltage.

5. The circuit of claim 1, further comprising a pull-down circuit coupled to said control terminal of the second transistor, said pull-down circuit configured to sense a voltage on said control terminal of the second transistor and pull-down said control terminal voltage to a low supply voltage if the sensed voltage falls to a second threshold voltage.

6. The circuit of claim 1, further comprising a filter circuit coupled to the second intermediate node.

7. The circuit of claim 6, wherein the filter circuit comprises a series connected resistor and capacitor coupled between the second intermediate node and a low supply voltage node.

8. The circuit of claim 7, further comprising a driver circuit coupled to said control terminal of the second transistor, said driver circuit operable responsive to an enable signal to control a voltage on the control terminal to equal a supply voltage.

9. The circuit of claim 8, wherein the driver circuit comprises a pull-up transistor coupled to the control terminal of the second transistor and a pull-down transistor coupled to the control terminal of the second transistor, said driver circuit operable responsive to the enable signal to activate one of the pull-up transistor and pull-down transistor and deactivate the other of the pull-up transistor and pull-down transistor.

10. The circuit of claim 1, further comprising a driver circuit coupled to said control terminal of the second transistor, said driver circuit comprising:
 a pull-up circuit coupled to the control terminal of the second transistor;
 a pull-down circuit coupled to the control terminal of the second transistor;
 a first voltage sensing circuit configured to sense a rise in voltage on the control terminal of the second transistor to a first threshold and activate the pull-up circuit; and
 a second voltage sensing circuit configured to sense a fall in voltage on the control terminal of the second transistor to a second threshold and activate the pull-down circuit.

11. The circuit of claim 10, said driver circuit operable responsive to an enable signal to control passage of output signals from the first and second voltage sensing circuits to the pull-up and pull-down circuits, respectively.

12. The circuit of claim 11, wherein the driver circuit comprises logic circuitry responsive to the enable signal and operable to control passage of said output signals.

13. The circuit of claim 1, wherein said load comprises a display panel of the AMOLED type.

14. The circuit of claim 1, wherein the drive circuit is one of a low side drive circuit or high side drive circuit configured to drive the load at the first intermediate node.

15. A circuit, comprising:
 a drive circuit including a first transistor coupled in series with a second transistor at a first intermediate node configured to be coupled to a load;
 an amplifier having a first input coupled to a second intermediate node, a second input coupled to a reference voltage and an output coupled to a control terminal of the second transistor;
 a feedback circuit coupled between the first intermediate node and the second intermediate node; and
 a slope control circuit coupled the second intermediate node and configured to control the output of the amplifier in setting a slope for change in voltage at the first intermediate node in response to a control signal that is not dependent on an output signal at the first intermediate node.

16. The circuit of claim 15, wherein the feedback circuit comprises a capacitor coupled between the first intermediate node and the second intermediate node.

17. The circuit of claim 15, wherein the slope control circuit comprises a variable current source having a control input configured to receive said control signal and output a value of current for input to said second intermediate node.

18. The circuit of claim 17, wherein the slope control circuit further comprises a variable resistor connected to said control input of the variable current source.

19. The circuit of claim 15, further comprising a clamp circuit configured to clamp a voltage at the second intermediate node to a value substantially equal to a clamp reference voltage.

20. The circuit of claim 15, further comprising a pull-up circuit coupled to said control terminal of the second transistor, said pull-up circuit configured to sense a voltage on said control terminal of the second transistor and pull-up said control terminal voltage to a high supply voltage if the sensed voltage rises to a first threshold voltage.

21. The circuit of claim 15, further comprising a pull-down circuit coupled to said control terminal of the second transistor, said pull-down circuit configured to sense a voltage on said control terminal of the second transistor and pull-down said control terminal voltage to a low supply voltage if the sensed voltage falls to a second threshold voltage.

22. The circuit of claim 15, further comprising a filter circuit coupled to the second intermediate node.

23. The circuit of claim 15, further comprising a driver circuit coupled to said control terminal of the second transistor, said driver circuit comprising:
 a pull-up circuit coupled to the control terminal of the second transistor;
 a pull-down circuit coupled to the control terminal of the second transistor;
 a first voltage sensing circuit configured to sense a rise in voltage on the control terminal of the second transistor to a first threshold and activate the pull-up circuit; and
 a second voltage sensing circuit configured to sense a fall in voltage on the control terminal of the second transistor to a second threshold and activate the pull-down circuit.

* * * * *

UNITED STATES PATENT AND TRADEMARK OFFICE
CERTIFICATE OF CORRECTION

| | | |
|---|---|---|
| PATENT NO. | : 9,236,854 B2 | Page 1 of 1 |
| APPLICATION NO. | : 13/888843 | |
| DATED | : January 12, 2016 | |
| INVENTOR(S) | : Meng Wang et al. | |

It is certified that error appears in the above-identified patent and that said Letters Patent is hereby corrected as shown below:

In the Specification:

At column 3, line number 55, please replace the word [re-channel] with the word

-- n-channel --.

At column 4, line number 7, please replace the word [re-channel] with the word

-- n-channel --.

Signed and Sealed this
Twenty-sixth Day of April, 2016

Michelle K. Lee
*Director of the United States Patent and Trademark Office*